United States Patent [19]

Holzer et al.

[11] 3,762,967

[45] Oct. 2, 1973

[54] METHOD OF PRODUCING A SEMICONDUCTOR DEVICE

[75] Inventors: Helmut Holzer; Werner Scherber, both of Heilbronn, Germany

[73] Assignee: Licentia Patent-Verwaltungs-G.m.b.H., Frankfurt am Main, Germany

[22] Filed: Mar. 31, 1971

[21] Appl. No.: 129,814

[30] Foreign Application Priority Data

Apr. 10, 1970 Germany .................. P 20 17 175.9

[52] U.S. Cl. .................. 148/187, 117/217, 148/1.5, 317/234

[51] Int. Cl. .................. H01l 7/34

[58] Field of Search .................. 148/1.5, 186, 187; 117/217; 317/234, 235

[56] References Cited

UNITED STATES PATENTS 3,360,695 12/1967 Lindmayer .................. 317/234
3,194,681 7/1965 Nicholson et al. .................. 117/5.5
3,455,020 7/1969 Dawson et al. .................. 29/571
3,449,644 6/1969 Nassibian .................. 148/1.5 X
3,067,485 12/1962 Ciccolella et al. .................. 148/186 X

OTHER PUBLICATIONS

Chou, N. J., "Control of Thick Oxide–etc." IBM Technical Disclosure Bulletin, Vol. 11, No. 2, July 1968, p. 94.

*Primary Examiner*—L. Dewayne Rutledge
*Assistant Examiner*—J. M. Davis
*Attorney*—Spencer & Kaye

[57] ABSTRACT

A method of producing a semiconductor body comprising producing at least two semiconductor regions of different types of conductivity, applying an atomic or molecular distribution of particles, which in conjunction with the material of the semiconductor body assumes a negative charge, onto an exposed region of the semiconductor body over at least one of said regions and covering the semiconductor body surface with an insulating layer.

12 Claims, 5 Drawing Figures

PATENTED OCT 2 1973 3,762,967

Inventors
Helmut Holzer
Werner Scherber
BY Spencer & Kaye
ATTORNEYS.

METHOD OF PRODUCING A SEMICONDUCTOR DEVICE

BACKGROUND OF THE INVENTION

The invention relates to a method of producing a semiconductor device with a passivated semiconductor surface and having at least two regions of different types of conductivity.

The majority of semiconductor components and semiconductor circuits used today are passivated with an insulating layer at the surface of the semiconductor body used. Silicon dioxide or silicon nitride are particularly suitable as insulating layers. It is inevitable, however, that electrical displacement phenomena should occur in the insulating layers and influence the surface characteristics of the devices and hence their electrical characteristics. Thus it has been found that ions, for example sodium ions, are present in the oxide layers, and their positive charges cause bending of the conduction bands at the semiconductor surface. In the extreme case, the positive ions in the oxide layer can cause an inversion layer as a result of accumulation of electrons at the surfaces of regions of p-type conductivity, and this may lead to short-circuiting between two regions of n-type conductivity separated by the region of p-type conductivity. If a p-n junction is loaded in the reverse direction, and if the n-type region has a higher resistance than the region of p-type conductivity, then the extent of the space charge region in the semiconductor body will be greater than at the semiconductor surface because the accumulation of electrons at the surface of the region of n-type conductivity bordering on the region of p-type conductivity, caused by positive ions in the oxide, renders the spread of the space charge region difficult at the surface. As a result, the field strength increases to a greater extent at the semiconductor surface than in the interior of the semiconductor body. Thus a surface breakdown will occur already with a reverse voltage at which a volume breakdown in the adjacent regions is still out of the question because of the doping conditions. Thus the positively charged ions in the insulating layer passivating the semiconductor surface are at least co-responsible for premature dielectric breakdown of semiconductor devices.

Because an accumulation of minority charge carriers occurs at the surface of regions of p-type conductivity because of the positive ions in the insulating layer, an increase in the reverse current is associated with the unwanted ions in the insulating layer. This applies in particular to devices having p-n junctions, wherein the region of p-type conductivity has a higher resistance than the region of n-type conductivity. In order to avoid these disadvantageous influences, it has already been proposed that the oxide layers should be doped with phosphorus. Another proposal consists in placing protective regions round the p-n junctions stressed in the reverse direction, which protective regions absorb some of the reverse potential during the spread of the space charge region. Field electrodes are intended to avoid the formation of inversion layers at the semiconductor surface in transistors.

All counter measures hitherto known, however, either did not lead to satisfactory results or were too expensive to realize.

SUMMARY OF THE INVENTION

It is an object of the invention to avoid or reduce the above mentioned disadvantages.

According to the invention, there is provided a method of producing a semiconductor device comprising the steps of producing at least two regions of different types of conductivity in a semiconductor body, applying an atomic or molecular distribution of particles, which in conjunction with the material of said semiconductor body assume a negative charge, onto an exposed region of said semiconductor body over at least one of said regions and covering said semiconductor body on its surface to which said particles have been applied with an insulating layer.

Further according to the invention, there is provided a method of producing a semiconductor device comprising the steps of producing at least two region of different types of conductivity in a semiconductor body, removing at least partially a masking layer covering the surface of said semiconductor body and produced during the production of said at least two regions, applying an atomic or molecular distribution of particles, which in conjunction with the material of said semiconductor body assume a negative charge, to said exposed semiconductor surface and covering said semiconductor surface with an insulating layer.

BRIEF DESCRIPTION OF THE DRAWINGS

The invention will now be described in greater detail, by way of example, with reference to the accompanying drawings, in which.

DESCRIPTION OF THE PREFERRED EMBODIMENT

Basically, in a method of producing a semiconductor device with a passivated semiconductor surface and at least two regions of different types of conductivity, it is proposed that, after the production of the semiconductor regions, the masking layer covering the semiconductor surface should be at least partially removed, that particles which, in conjunction with the semiconductor material, assume a negative charge should be applied to the exposed semiconductoir surface in atomic or molecular distribution, and that then the semiconductor surface should be covered with an insulating layer.

The said particles are primarily individual atoms which are distributed over the semiconductor surface in a monoatomic coating. This does not have to be a closed monoatomic layer but the particles may also be disposed non-coherently on the semiconductor surface.

After the attachment of the particles to the semiconductor surface, the formation or the completion of the insulating layer must be effected at a temperature at which no indiffusion or only an insignificant indiffusion of the applied particles into the semiconductor body takes place.

Accordingly, silicon nitride may be selected for example as material for the insulating layer, which is deposited at a lower temperature on the semiconductor surface by means of a glow discharge in an atomsphere of silane-nitrogen.

The attached particles at the semiconductor surface preferably consist of metal atoms, particulary of gold atoms. In a preferred embodiment, the gold atoms are applied to the semiconductor surface from a chloroauric acid.

The semiconductor devices, for example n-p-n transistors, which were produced according to the invention, had extremely high reverse voltages. Thus the reverse voltages could be increased by substantially 100 percent in comparison with similar devices, the surface of which have not been treated in the proposed manner. The reverse currents were reduced in a corresponding manner, for example in p-n-p transistors. The advantageous effect of the method according to the invention was shown particularly clearly on measuring the capacitance of a MOS device to the semiconductor surface of which there were attached gold atoms. The capacitance-voltage curves were shifted greatly towards positive voltages in comparison with curves for surfaces not enriched with gold atoms. This means that depletion and inversion of the semiconductor surface only occurs at higher positive voltages so that there cannot be an accumulation of electrons at the surface of the basic semiconductor body in the deenergised device.

Figure 1:
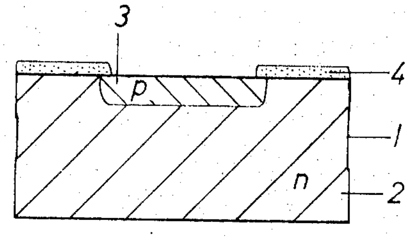
FIG. 1 is a sectional view of a semiconductor body at a first stage of a method in accordance with the invention.

Referring now to the drawings, FIG. 1 shows a semiconductor body 1, for example of silicon. A region 3 of p-type conductivity, which forms the base region in the transistor to be produced, is introduced into the basic body 2 of n-type conductivity, using the known masking and diffusion technique. A silicon dioxide layer for example is used as a masking layer 4.

Figure 2:
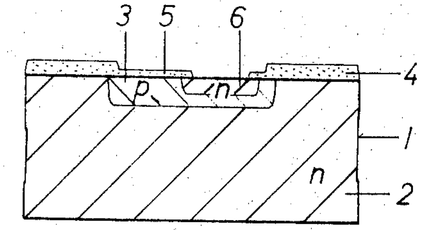
FIG. 2 is a view similar to FIG. 1 but showing a second stage of the method.

After the production of the base region 3, the base diffusion window is oxidised closed again and the emitter diffusion window is opened in this newly formed oxide layer 5, as shown in FIG. 2. Then the emitter region 6 is diffused into the base region through this window. The the whole masking layer 3,5 is removed in hydrofluoric acid. In this case, the semiconductor surface is subjected to a cleaning process at the same time.

Figure 3:
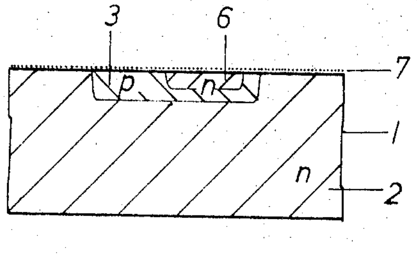
FIG. 3 is a view similar to FIG. 1 but showing a third stage of the method.

At this preliminary treatment, the exposed semiconductor surface is treated in chloroauric acid. A treatment period of about 15 minutes under ultrasonic has provide suitable. During this time, gold atoms 7 are bonded at the semiconductor surface as shown in FIG. 3. As a result of appropriate charge exchange between Si and gold atoms, the attached particle acquires a negative charge which later serves to compensate for positively charged ions in the passivation layer.

Attention is drawn to the fact that, in many cases, it is sufficient to remove only portions of the masking layers. Thus the masking layer may be removed above the surface areas of regions of n-type or p-type conductivity, depending on whether a higher breakdown voltage or a low reverse current is required.

Figure 4:
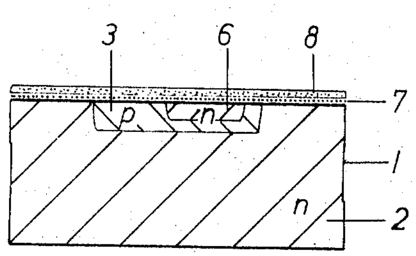
FIG. 4 is a view similar to FIG. 1 but showing a fourth stage of the method.

An insulating layer is now applied to the semiconductor surface at which gold atoms have been attached, in order to passivate the p-n junctions. This insulating layer, which is designated by the reference numeral 8 in FIG. 4 consists of silicon nitride for example. The siliconnitride layer is produced, for example, by a glow discharge in an atmosphere of silane-nitrogen at about 350°C. Passivation of the semiconductor surfaces with a nitride layer is also possible at room temperature.

There are, of course, other possible methods of producing the insulating layer 8. The insulating layer may be sputtered on or be precipitated from a solution.

Figure 5:
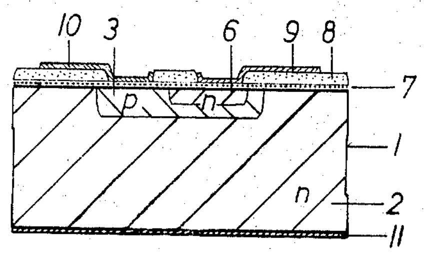
FIG. 5 is a view similar to FIG. 1 but showing the completed semiconductor device.

The gold atoms may also be applied to the exposed semiconductor surface by gentle sputtering in the gaseous phase, by vapour-deposition or by means of glow discharge. Contact-making windows, in which the emitter and base region are connected by the vapour-deposited metal contacts 9 and 10, are introduced into the silicon-nitride layer 8, shown in FIG. 5. The collector region is provided with the large-area contact 11 at the surface of the semiconductor body opposite the contact 10 and 9.

The method according to the invention can be used for p-n-p and n-p-n transistors. It is used to particular advantage for n-p-n power transistors with a high reverse voltage rating and for p-n-p transistors with a lower reverse current. Rectifiers, MOS field effect transistors and other semiconductor devices may also be produced by the method according to the invention, however.

It will be understood that the above description of the present invention is susceptible to various modifications, changes and adaptations.

What is claimed is:

1. A method of producing a semiconductor device comprising the steps of producing at least two regions of different types of conductivity in a semiconductor body, depositing a layer composed of an atomic or molecular distribution of particles onto the surface of the semiconductor body, which in conjunction with the material of said semiconductor body assume a negative charge, onto an exposed region of said semiconductor body over at least one of said regions and covering said layer of particles on the surface of said semiconductor body with an insulating layer.

2. A method of producing a semiconductor device comprising the steps of producing at least two regions of different types of conductivity in a semiconductor body, removing at least partially a masking layer covering the surface of said semiconductor body and produced during the production of said at least two regions, depositing a layer composed of an atomic or molecular distribution of particles onto the surface of the semiconductor body which in conjunction with the material of said semiconductor body assume a negative charge, to said exposed semiconductor surface and covering said layer of particles on said semiconductor surface with an insulating layer.

3. A method as defined in claim 2, and comprising applying said insulating layer to said semiconductor body at a temperature at which no indiffusion or only insignificant indiffusion of the applied particles into the semiconductor body takes place.

4. A method as defined in claim 2, wherein said particles comprise metal atoms in atomic distribution.

5. A method as defined in claim 4, wherein said metal atoms comprise gold atoms.

6. A method as defined in claim 5, and comprising depositing said gold atoms onto said semiconductor surface from chloroauric acid.

7. A method as defined in claim 6, and comprising surface etching said semiconductor surface with hydrofluoric acid before the deposition from said chloroauric acid.

8. A method as defined in claim 6, and comprising ultrasonically treating said exposed semiconductor surface chloroauric acid for about 15 minutes.

9. A method as defined in claim 5, and comprising applying a silicon-nitride layer is applied to the atomically distributed gold coating as said insulating layer.

10. A method as defined in claim 9, and comprising producing said silicon-nitride layer in an atmosphere of silane nitrogen, by glow discharge.

11. A method as defined in claim 2, and comprising removing said masking layer from the whole surface of said semiconductor body comprising regions of different types of conductivity.

12. A method as defined in claim 2, and comprising removing said masking layer only over the surface areas of p-type semiconductor regions.

* * * * *